US006921939B2

(12) United States Patent
Zeng

(10) Patent No.: US 6,921,939 B2
(45) Date of Patent: Jul. 26, 2005

(54) POWER MOSFET AND METHOD FOR FORMING SAME USING A SELF-ALIGNED BODY IMPLANT

(75) Inventor: Jun Zeng, Mountaintop, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 09/844,347

(22) Filed: Apr. 27, 2001

(65) Prior Publication Data

US 2002/0008284 A1 Jan. 24, 2002

Related U.S. Application Data

(60) Provisional application No. 60/219,858, filed on Jul. 20, 2000.

(51) Int. Cl.[7] .......................... H01L 29/76; H01L 29/94; H01L 31/062; H01L 31/113; H01L 31/119
(52) U.S. Cl. ...................... 257/330; 257/301; 257/302; 257/303; 257/304; 257/305; 257/328; 257/329; 257/331; 257/332; 257/333; 257/334; 257/905
(58) Field of Search ............................. 257/301–305, 257/905, 328–334

(56) References Cited

U.S. PATENT DOCUMENTS

| | | | | |
|---|---|---|---|---|
| 4,694,313 A | * | 9/1987 | Beasom ...................... 257/138 |
| 5,283,201 A | | 2/1994 | Tsang et al. .................. 437/31 |
| 5,283,452 A | * | 2/1994 | Shih et al. ................... 257/277 |
| 5,349,224 A | * | 9/1994 | Gilbert et al. ............... 257/333 |
| 5,366,914 A | | 11/1994 | Takahashi et al. ............ 437/41 |
| 5,378,655 A | * | 1/1995 | Hutchings et al. .......... 438/138 |
| 5,567,634 A | * | 10/1996 | Hebert et al. ................ 438/270 |
| 5,583,060 A | | 12/1996 | Hertrich et al. .............. 437/31 |
| 5,629,543 A | * | 5/1997 | Hshieh et al. ............... 257/330 |
| 5,665,619 A | * | 9/1997 | Kwan et al. ................. 438/270 |
| 5,721,148 A | * | 2/1998 | Nishimura ................... 437/40 |
| 5,801,082 A | * | 9/1998 | Tseng .......................... 438/424 |
| 5,801,417 A | * | 9/1998 | Tsang et al. ................. 257/333 |
| 5,891,776 A | * | 4/1999 | Han et al. .................... 438/274 |
| 5,960,311 A | * | 9/1999 | Singh et al. ................. 438/623 |
| 5,981,354 A | * | 11/1999 | Spikes et al. ............... 438/424 |
| 6,008,520 A | * | 12/1999 | Darwish et al. ............. 257/330 |
| 6,037,628 A | | 3/2000 | Huang ......................... 257/329 |
| 6,072,215 A | * | 6/2000 | Kawaji et al. ............... 257/334 |
| 6,121,089 A | | 9/2000 | Zeng et al. .................. 438/268 |
| 6,140,678 A | * | 10/2000 | Grabowski et al. ......... 257/328 |
| 6,184,092 B1 | * | 2/2001 | Tseng et al. ................. 438/272 |
| 6,188,104 B1 | * | 2/2001 | Choi et al. ................... 257/330 |

(Continued)

FOREIGN PATENT DOCUMENTS

WO      WO 97/07548    *   8/1996    ........... H01L/29/78

OTHER PUBLICATIONS

Zeng, *An Improved Power MOSFET Using a Novel Split Well Structure*, Harris Corporation, Semiconductor Section, Technical Publication, 4 pages.

Zeng et al., *An Ultra Dense Trench–Gated Power MOSFET Technology Using a Self–Aligned Process*, Intersil Corporation, Technical Publication, 4 pages.

*Primary Examiner*—Amir Zarabian
*Assistant Examiner*—Ida M. Soward
(74) *Attorney, Agent, or Firm*—Allen, Dyer, Doppelt, Milbrath & Gilchrist, P.A.

(57) ABSTRACT

A method for making a power MOSFET includes forming a trench in a semiconductor layer, forming a gate dielectric layer lining the trench, forming a gate conducting layer in a lower portion of the trench, and forming a dielectric layer to fill an upper portion of the trench. Portions of the semiconductor layer laterally adjacent the dielectric layer are removed so that an upper portion thereof extends outwardly from the semiconductor layer. Spacers are formed laterally adjacent the outwardly extending upper portion of the dielectric layer, the spacers are used as a self-aligned mask for defining source/body contact regions.

16 Claims, 11 Drawing Sheets

U.S. PATENT DOCUMENTS

| | | | | |
|---|---|---|---|---|
| 6,188,105 B1 | * | 2/2001 | Kocon et al. | 257/330 |
| 6,229,194 B1 | * | 5/2001 | Lizotte | 257/506 |
| 6,246,090 B1 | * | 6/2001 | Brush et al. | 257/329 |
| 6,262,453 B1 | * | 7/2001 | Hshieh | 257/341 |
| 6,351,009 B1 | * | 2/2002 | Kocon et al. | 257/328 |
| 6,351,018 B1 | * | 2/2002 | Sapp | 257/499 |
| 6,368,920 B1 | * | 4/2002 | Beasom | 438/270 |
| 6,373,098 B1 | * | 4/2002 | Brush et al. | 257/330 |
| 6,396,102 B1 | * | 5/2002 | Calafut | 257/331 |
| 6,444,527 B1 | * | 9/2002 | Floyd et al. | 438/268 |
| 6,710,406 B2 | * | 3/2004 | Mo et al. | 257/341 |
| 2001/0022379 A1 | * | 9/2001 | Brush et al. | 257/329 |
| 2001/0023104 A1 | * | 9/2001 | Mo | 438/270 |
| 2001/0028084 A1 | * | 10/2001 | Mo | 257/330 |
| 2002/0000608 A1 | * | 1/2002 | Harada | 257/328 |
| 2002/0019099 A1 | * | 2/2002 | Williams et al. | 438/270 |
| 2002/0038886 A1 | * | 4/2002 | Mo | 257/330 |
| 2002/0096709 A1 | * | 7/2002 | Wu et al. | 257/329 |
| 2003/0060013 A1 | * | 3/2003 | Marchant et al. | 438/270 |

* cited by examiner

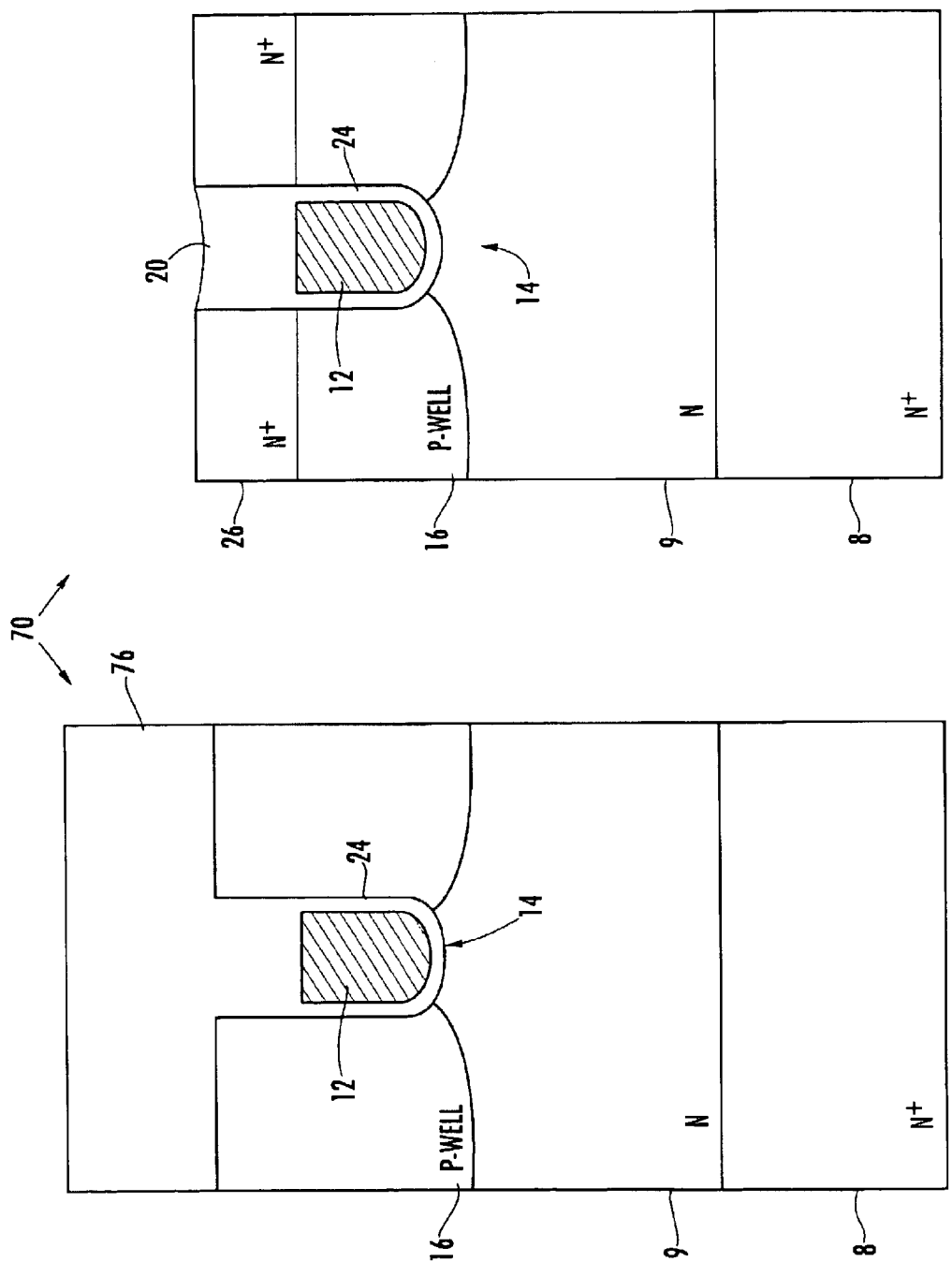

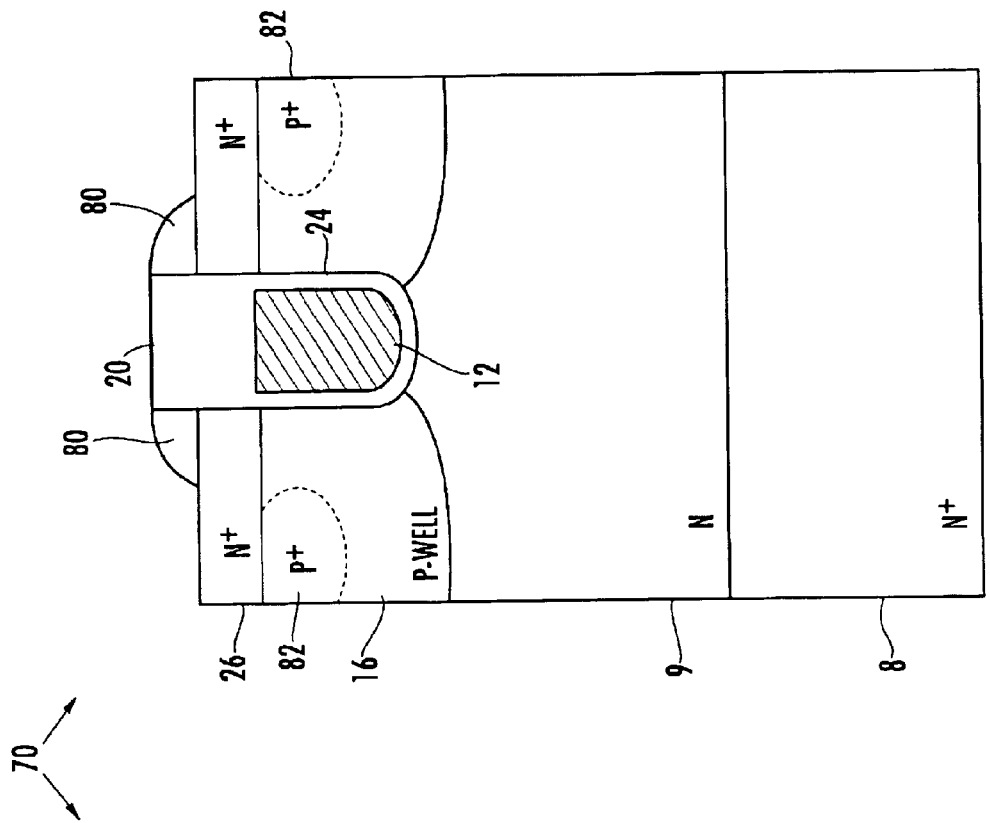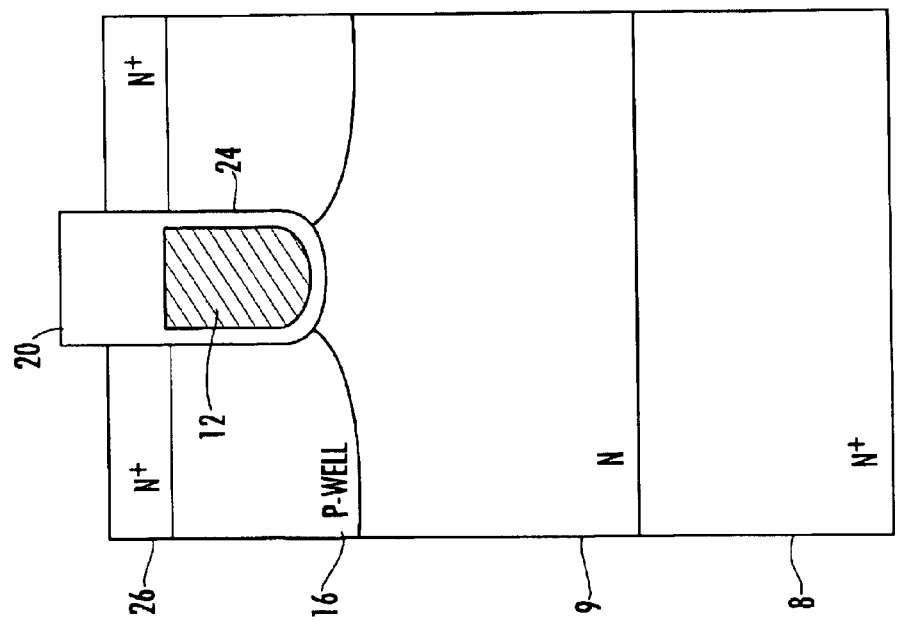
FIG. 10.
FIG. 9.

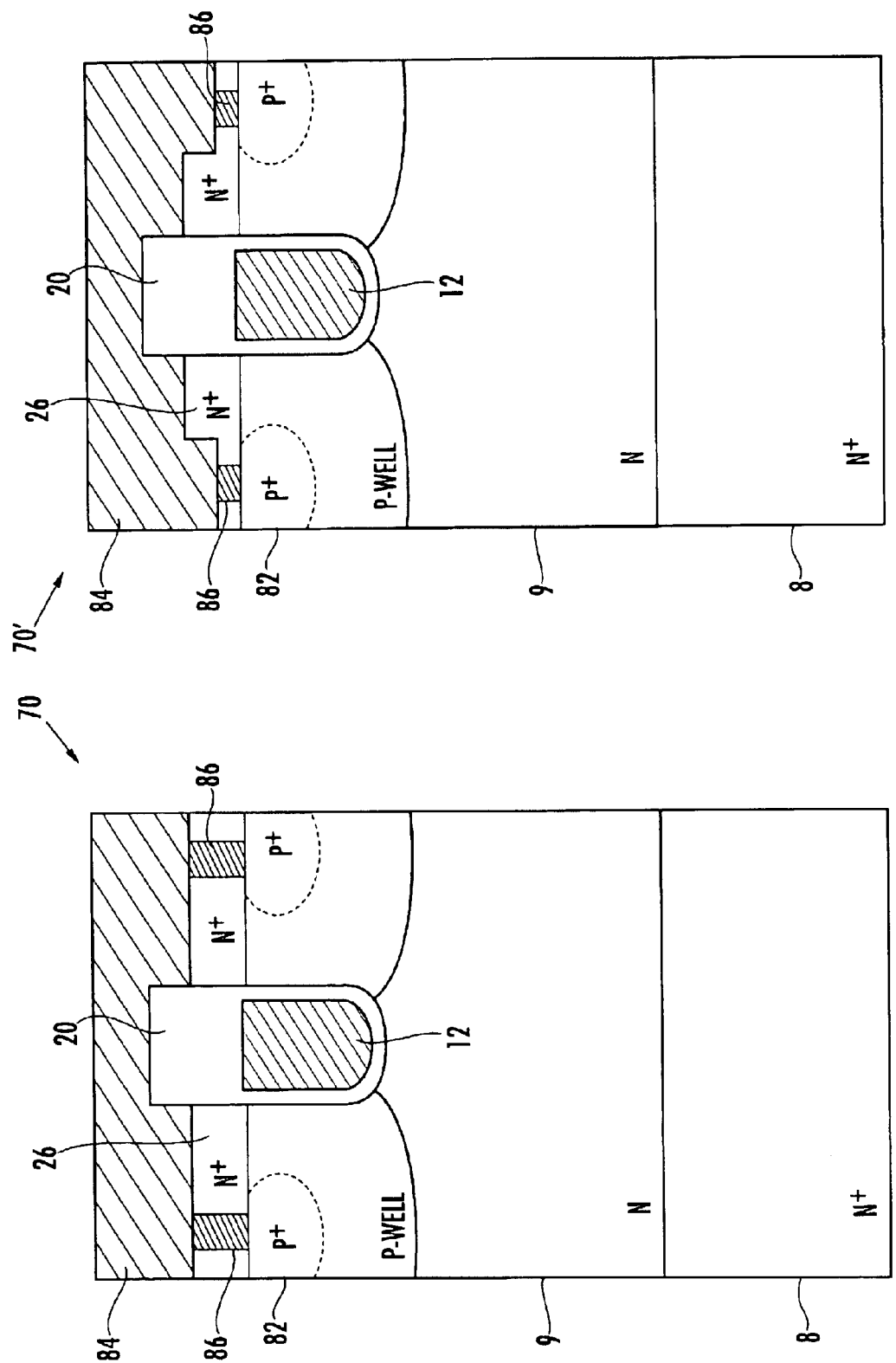

POWER MOSFET AND METHOD FOR FORMING SAME USING A SELF-ALIGNED BODY IMPLANT

RELATED APPLICATION

This application is based upon prior filed copending provisional application No. 60/219,858 filed Jul. 20, 2000, the entire disclosure of which is incorporated herein by reference.

FIELD OF THE INVENTION

The present invention relates to the field of semiconductor devices, and, more particularly, to a trench-gated power MOSFET.

BACKGROUND OF THE INVENTION

The electronic industry has demonstrated a great need for small discrete power MOSFETs with low on-resistances (RDSon), large blocking voltages (VDSBR), and low gate charges in addition to adequate ruggedness. Ruggedness defines the safe operating area (SOA) and the unclamped inductive switching (UIS) of the device. With an optimum combination of these characteristics, extremely low on-state power losses and switching losses can be achieved, resulting in high power conversion efficiencies in systems such as DC-DC converters.

Ultra dense trench-gated power MOSFET technology has been developed to meet these needs. By shrinking cell pitch, i.e., reducing the size of the power MOSFET so that more power MOSFETs can be formed per square area of silicon, a lower on-resistance can be achieved. But often this is accompanied by a decrease in device ruggedness. In order to resolve this negative impact, the device having a reduced cell pitch must be designed to absorb more energy (including DC and dynamic power dissipations) before catastrophic failure occurs.

The basic concept of trench-gated power MOSFET technology is illustrated with reference to FIGS. 1–3. FIG. 1 represents a conventional trench-gated power MOSFET 10. A gate 12 is in a trench 14 formed within a P-well 16. With respect to forming the source/body contact regions 18, a corresponding etch mask must be aligned to the trench 14. The dielectric layer 20 between the source electrode 22 and the gate oxide layer 24 overlays a portion of the flat surface of the N+ source region 26. The dimension of the dielectric layer 20 that overlays the N+ source region 26 is determined by the maximum gate-source rating. Therefore, the minimum cell pitch of the conventional structure is limited by the source/body contact masking misalignment tolerance plus the spacing taken by the surface dielectric layer 20.

This limitation is eliminated by using the trench technology illustrated in FIGS. 2 and 3. In the resulting device structure 28, the gate 12 is recessed into the trench 14, leaving a recess region large enough for the dielectric layer 20. The depth of the recess region, which will determine the final thickness of the dielectric layer 20, is determined by the maximum gate-source rating. After the dielectric layer 20 has been deposited, it is etched back using the flat silicon surface 32 as the ending point.

Compared to the conventional trench-gated power MOSFET 10 as shown in FIG. 1, this device 28 provides very high channel densities. The cross sectional views of this device 28 at the different locations labeled 3*a* and 3*b* in FIG. 2 are respectively illustrated in FIGS. 3*a* and 3*b*. In order to form the device 28 with a very small cell pitch without the stringent requirement of the source/body contact etch mask step, the P+ source/body contact region 18 is interrupted and periodically placed along its N+ stripe, where the N+ source region 26 is completely excluded.

Unfortunately, the periodic placement of the P+ source/body contact region 18 increases the on-resistance of the device 28, as well as the base resistance and the common base current gain of the parasitic BJT. The parasitic BJT is formed by the N+ source region 26, the P-well 16 and the N epitaxial layer 9. As a consequence, the parasitic BJT will be turned on at a very low current, resulting in a poor SOA and a lower UIS capability.

SUMMARY OF THE INVENTION

In view of the foregoing background, it is therefore an object of the present invention to provide a trench-gated power MOSFET with a reduced on-resistance and an associated method for forming the same.

It is another object of the present invention to provide the trench-gated power MOSFET without decreasing device ruggedness.

These and other advantages, features and objects in accordance with the present invention are provided by a method for making a power MOSFET comprising forming a trench in a semiconductor layer, forming a gate dielectric layer lining the trench, forming a gate conducting layer in a lower portion of the trench, and forming a dielectric layer to fill an upper portion of the trench.

The method preferably further includes removing portions of the semiconductor layer laterally adjacent the dielectric layer so that an upper portion thereof extends outwardly from the semiconductor layer. Spacers are preferably formed laterally adjacent the outwardly extending upper portion of the dielectric layer, and are preferably used as a self-aligned mask for defining source/body contact regions.

The resulting trench-gated power MOSFET is advantageously formed with a reduced on-resistance without degrading device ruggedness. The on-resistance is reduced since each MOSFET includes a source/body contact region. The source/body contact region provides an efficient short between the source and body regions of the MOSFET. As a result, device ruggedness is increased.

In addition, the on-resistance is reduced because the cell pitch of the power MOSFET is reduced as a result of the dielectric layer being formed completely within the trench. In other words, the dielectric layer is not on the surface of the source regions which would minimize the contact region between the source regions and the source electrode.

Another factor for reducing the on-resistance and the cell pitch of the power MOSFET is a result of using the spacers as a self-aligned mask for implanting dopants into the body region for defining the source/body contact regions. Since the spacers are self-aligned with the outwardly extending dielectric layer, source/body contact masking misalignment tolerances are avoided.

Another embodiment of the present invention is to further use the spacers as a self-aligned mask for removing a portion of the semiconductor layer not covered by the spacers prior to defining the source/body contact regions. With a portion of the semiconductor layer removed, lower energy is needed to implant the dopants for forming the source/body contact regions.

In addition, the source/body contact regions can preferably be formed deeper within the semiconductor layer as a result of a portion thereof being removed. This decreases the base resistance and the common base current gain of the parasitic BJT, which improves device ruggedness, i.e., the safe operating range (SOA) and the unclamped inductive switching (UIS) of the power MOSFET are increased.

Removing portions of the semiconductor layer is performed to a depth equal to or less than about 1 micron. The gate conducting layer is recessed in the trench within a range of about 0.2 to 0.8 microns from an opening thereof. The power MOSFET may be formed to have a cell pitch of about 0.5 microns, for example. The trench-gated power MOSFET may be either an n-channel or p-channel power MOSFET.

Another aspect of the present invention is directed to a MOSFET comprising a semiconductor layer having a trench therein, a gate dielectric layer lining the trench, and a gate conducting layer in a lower portion of the trench. The MOSFET preferably further includes a dielectric layer in an upper portion of the trench and extending outwardly from the semiconductor layer. Source regions are preferably adjacent the outwardly extending dielectric layer, and source/body contact regions are preferably laterally spaced from the gate conducting layer.

Another embodiment of the power MOSFET is with respect to the source regions, wherein a portion of the source regions include a recess over the source/body contact regions. In yet another embodiment, the source regions includes an opening exposing the body region so that the source electrode is in contact with the source/body contact regions.

BRIEF DESCRIPTION OF THE DRAWINGS

FIGS. 5–13 are cross-sectional views of a portion of a trench-gated power MOSFET illustrating the process steps in accordance with the preset invention.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout. The dimensions of layers and regions may be exaggerated in the figures for greater clarity.

Figure 1:
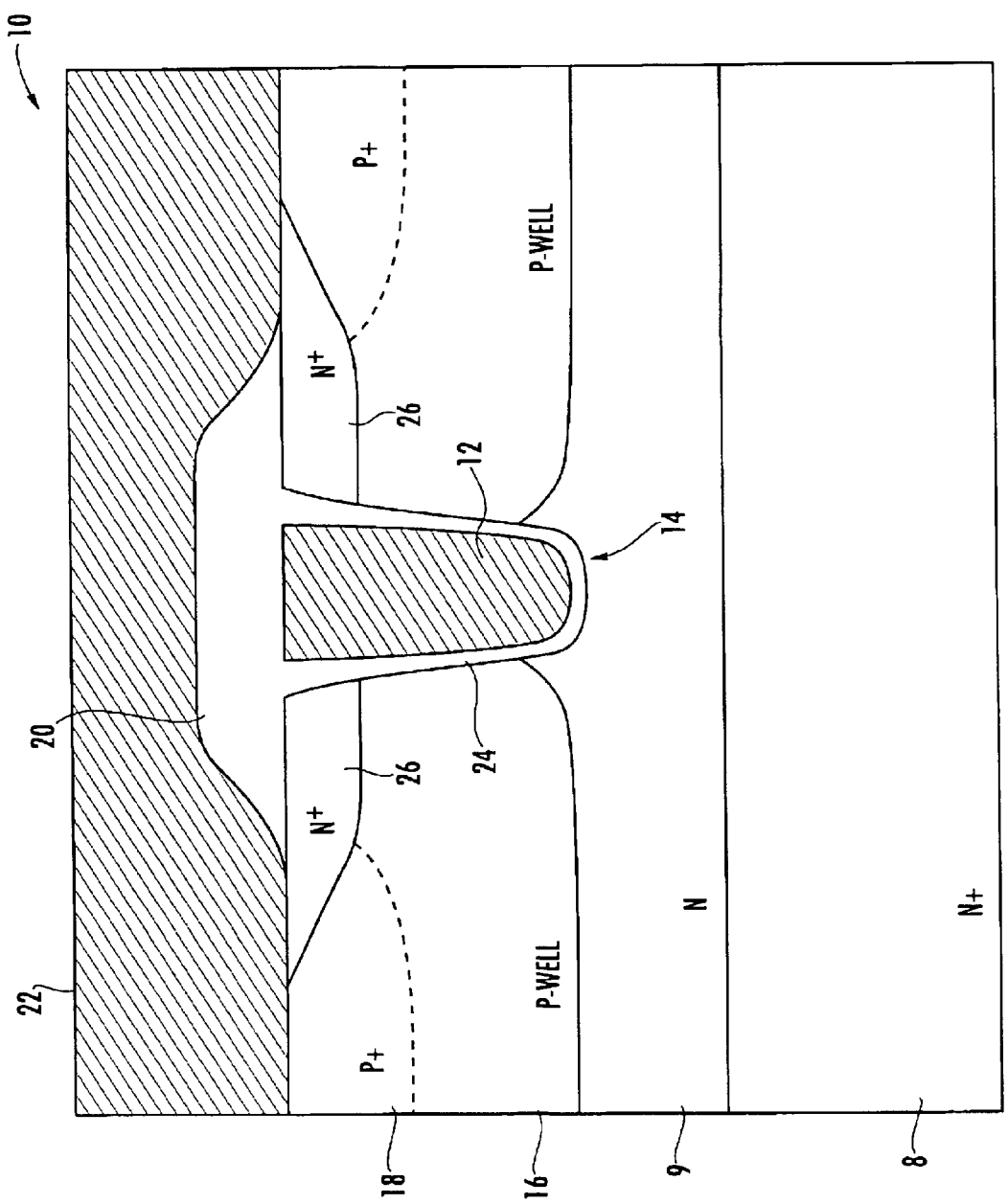
FIG. 1 is a conventional trench-gated power MOSFET according to the prior art.
Figure 2:
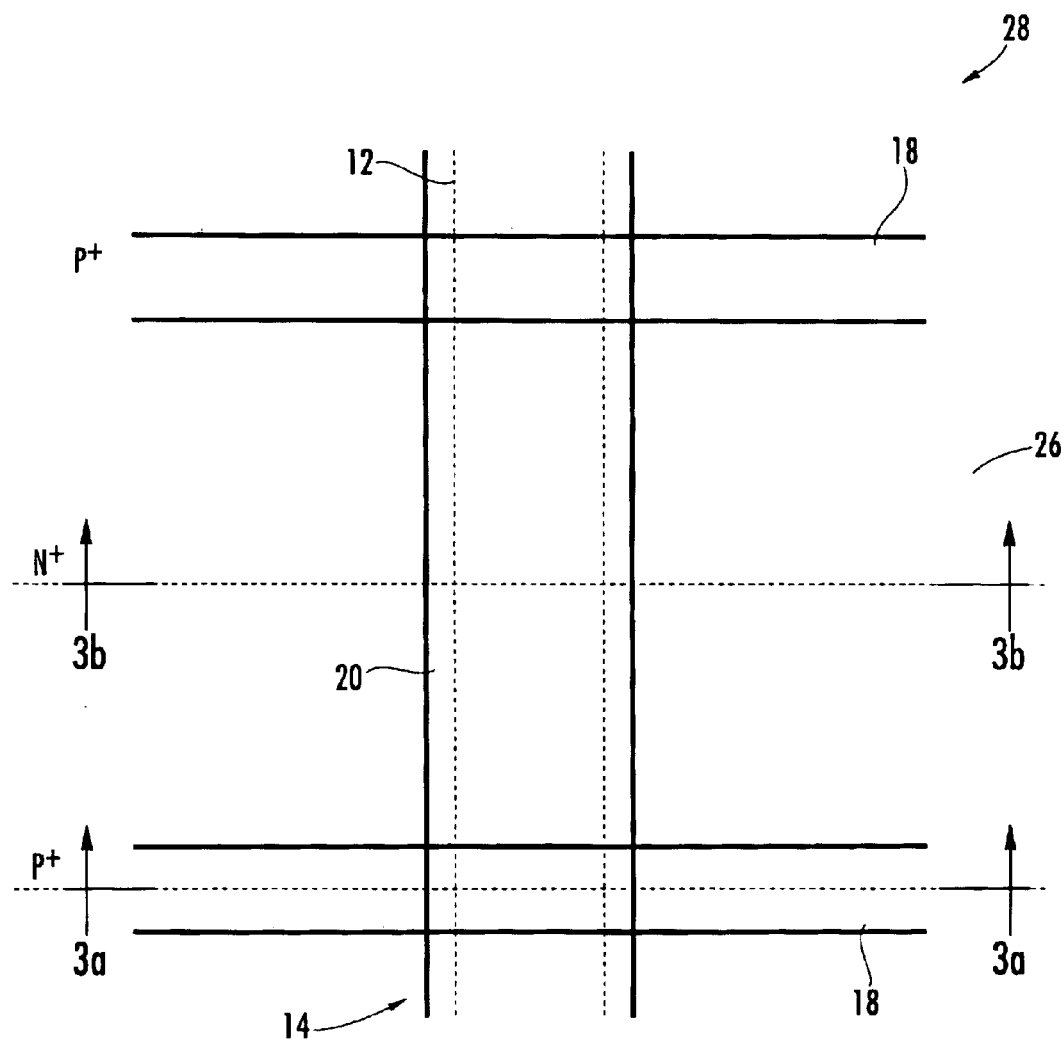
FIG. 2 is a top planar view of a trench-gated power MOSFET formed using trench technology according to the prior art.
Figures 3A, 3B:
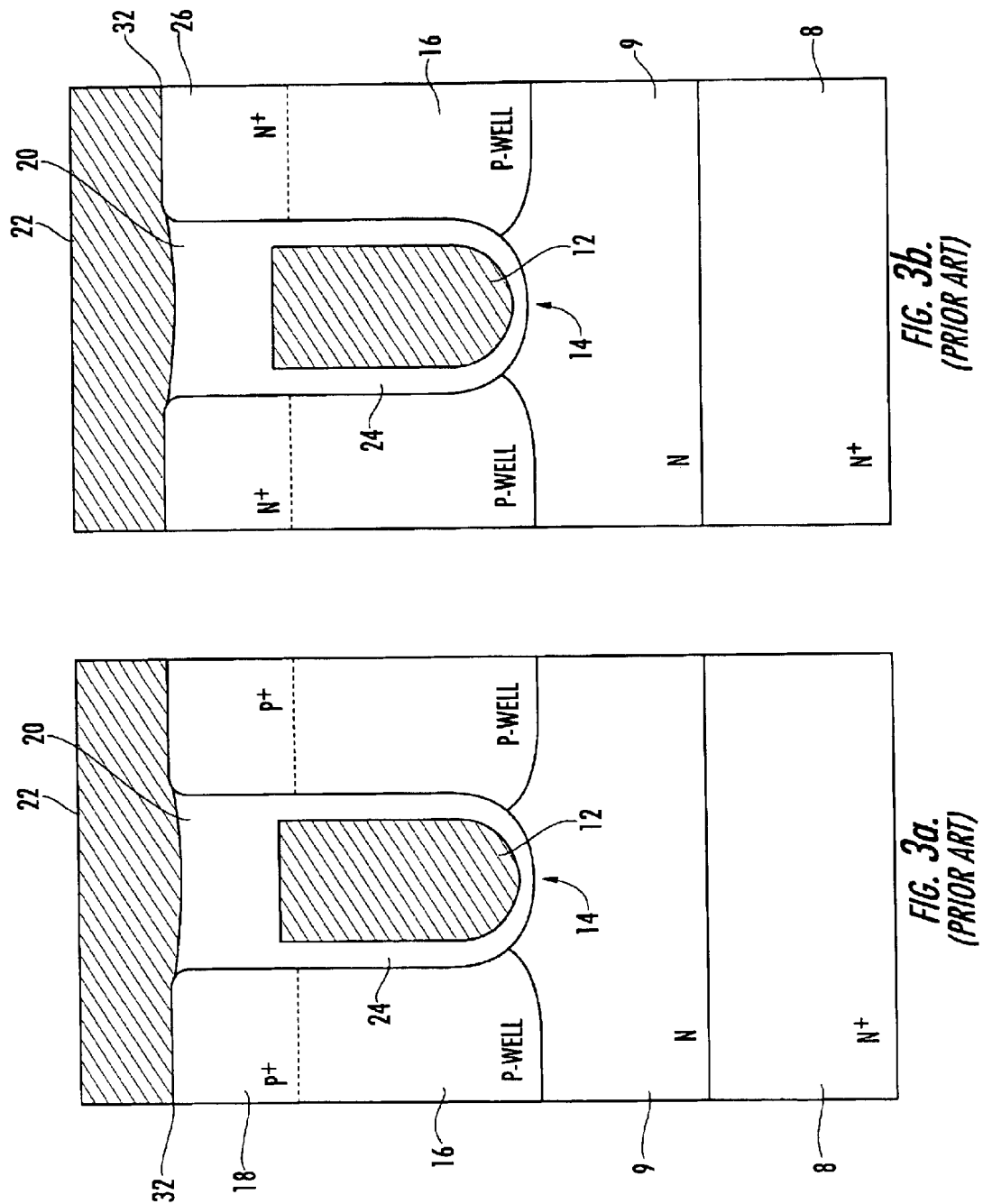
FIGS. 3a and 3b are cross-sectional views of the trench-gated power MOSFET illustrated in FIG. 2 respectively taken along lines 3a and 3b.
Figure 4:
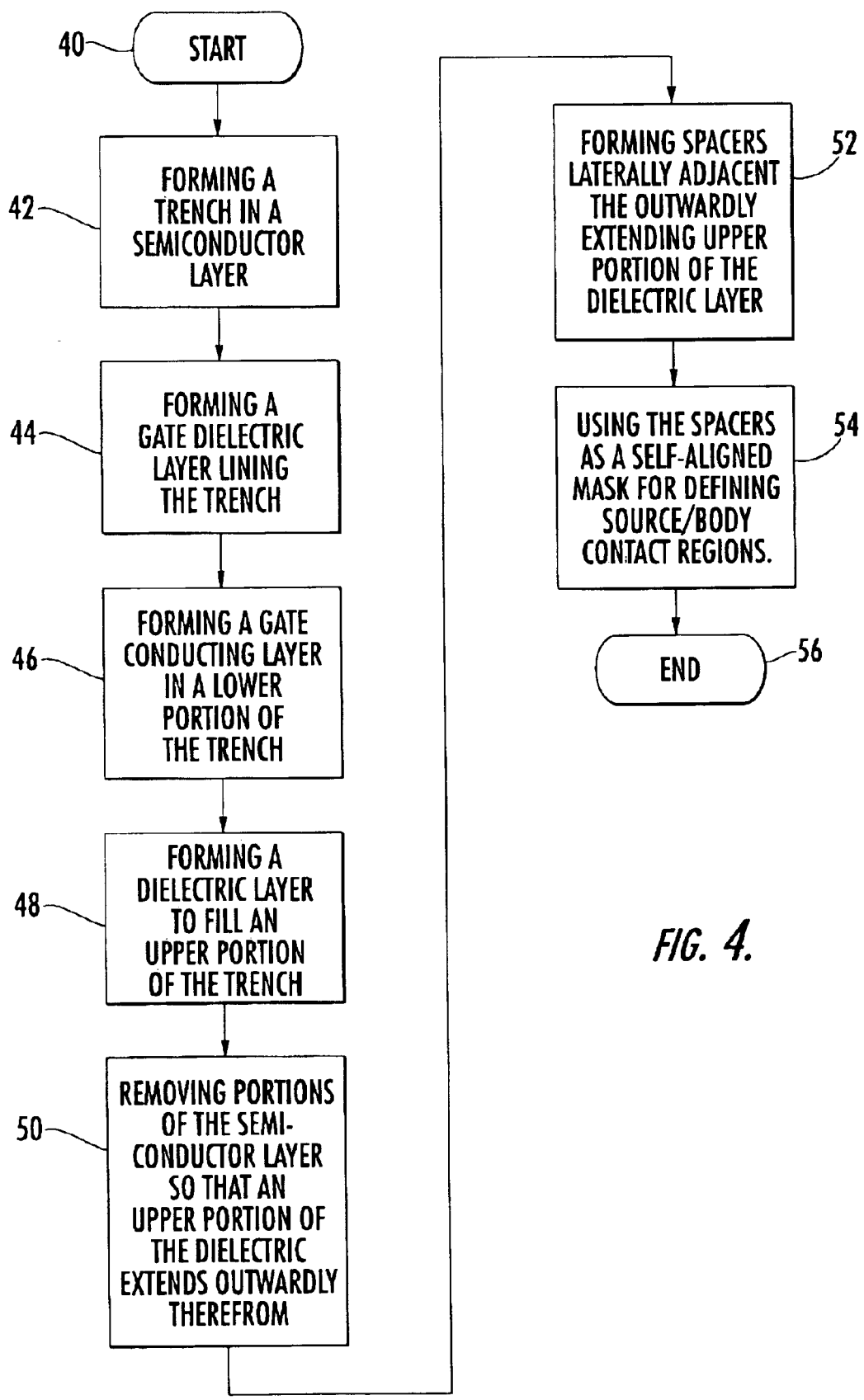
FIG. 4 is a flow chart illustrating the method for making a trench-gated power MOSFET in accordance with the present invention.

Referring now to FIG. 4, a method for making a trench-gated power MOSFET in accordance with the present invention is described. From the start (Block 40), a trench is formed in a semiconductor layer at Block 42, and a gate dielectric layer is formed to line the trench at Block 44. A gate conducting layer is then formed in a lower portion of the trench at Block 46. A dielectric layer is formed to fill an upper portion of the trench at Block 48.

The method further includes removing portions of the semiconductor layer laterally adjacent the dielectric layer so that an upper portion thereof extends outwardly from the semiconductor layer at Block 50. Spacers are formed laterally adjacent the outwardly extending upper portion of the dielectric layer at Block 52, and the spacers are used as a self-aligned mask for defining source/body contact regions at Block 54.

The method according to the present invention advantageously provides a high density power MOSFET with source/body contact regions that are formed in a self-aligned manner using the spacers. Since the spacers are self-aligned with the outwardly extending dielectric layer, the minimum cell pitch of the power MOSFET is not limited by source/body contact masking misalignment tolerances.

In addition, the on-resistance is decreased as a result of each MOSFET having source/body contact region. This also helps to decrease the base resistance and the common base current gain of the parasitic BJT. The parasitic BJT will be turned on at a higher current, resulting in an improved SOA and a higher UIS capability.

In addition, the on-resistance is reduced because the cell pitch of the power MOSFET is reduced as a result of the dielectric layer being formed completely within the trench. In other words, the dielectric layer is not on the surface of the source regions which would minimize the contact region between the source regions and the source electrode.

The process steps for making a trench-gated power MOSFET in accordance with the present invention will now be described with reference to FIGS. 5–13. Even though an n-channel power MOSFET 70 is illustrated in the referenced figures, the process steps may also be applied for forming a p-channel power MOSFET, as readily appreciated by one skilled in the art.

An n-type epitaxial layer 9 is formed on a semiconductor substrate 8. The semiconductor substrate 8 is also of the n-type and is preferably silicon. The epitaxial layer 9 supports the drain-to-source breakdown voltage of the power MOSFET 70, as readily understood by one skilled in the art.

A pad oxide layer 72 is grown on the epitaxial layer 9, followed by a p-type dopant implant to form the p-well or body region 16 of the power MOSFET 70. The p-type dopant, such as Boron, is implanted using a dose within a range of about $1E13/cm^2$ to $5E14/cm^2$, for example, and at an energy level within a range of about 40 to 200 keV, for example.

Figure 5:
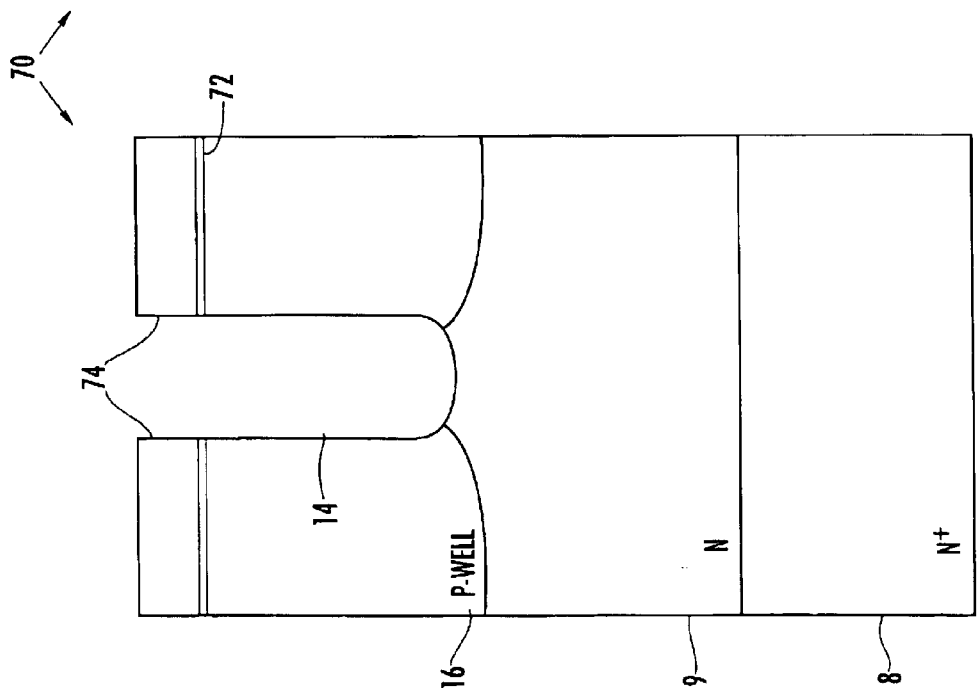

A mask 74 is formed on the surface of the pad oxide layer 72 for defining the trench 14. The mask 74 may be a low temperature oxide layer, for example. The body region 16 and the epitaxial layer 9 are etched to form the trench 14, as illustrated in FIG. 5. The mask 74 is then removed.

Figure 6:
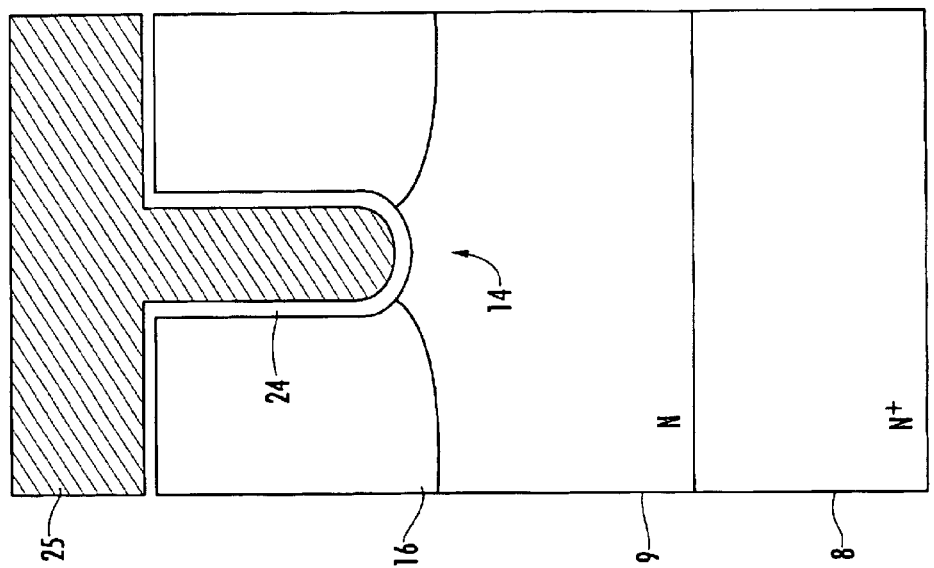

A gate dielectric layer 24 is grown on the side walls and a bottom wall of the trench 14, and on the surface of the body region 16. The gate dielectric layer 24 has a thickness within a range of about 10 to 100 nm. Conducting material 25, such as polysilicon, is deposited in the trench 14 and on the surface of the gate dielectric layer 24, as illustrated in FIG. 6.

Referring now to FIG. 7, the polysilicon 25 is removed from the surface of the p-well 16, and is etched back within the trench 14 to define a recessed gate 12 in a lower portion of the trench 14 for the power MOSFET 70. The depth of the gate 12 recessed within the trench 14 is within a range of about 0.2 to 0.8 microns from the opening of the trench.

A dielectric layer 76 is deposited on the surface of the gate dielectric layer 24 and on the surface of the gate 12. The dielectric layer 76 is for isolating the gate 12. The surface dielectric layer 76 is removed, and the upper surface of the body region 16 and the upper surface of the dielectric layer 20 within the trench 14 are planarized, as illustrated in FIG. 8.

After planarizing the upper surface of the body region 16 and the upper surface of the dielectric layer 20 within the trench 14, an n-type dopant is implanted into the body region 16 adjacent the dielectric layer to define the source regions 26 of the power MOSFET 70. The n-type dopant, such as Arsenic or Phosphorous, is implanted using a dose within a range of about $2E15/cm^2$ to $2E16/cm^2$, for example, and at an energy level within a range of about 40 to 200 keV, for example. An anneal is performed afterwards within a temperature range of about 900 to 1,100° C.

Surface portions laterally adjacent the dielectric layer are removed so that a portion of the dielectric layer 20 extends outwardly therefrom, as illustrated in FIG. 9. A thickness of the surface portions that is removed is within a range of about 0.1 to 1 micron. As will be explained in greater detail below, the outwardly extending dielectric layer 20 advantageously allows self-aligned spacers to be formed.

Since the dopant concentration of the source regions 26 may be reduced when the surface layer is etched, another source implant may be performed to enhance the doping concentration of the source regions. This enhancement may be performed using the same dose and energy levels as previously discussed. As an alternative to the disclosed process, implantation of the n-type dopants to define the source regions 26 may be performed after the surface portions laterally adjacent the dielectric layer has been removed to define the outwardly extended dielectric layer 20. In this way, only one implantation is performed to define the source regions 26.

A nitride deposition is then performed on the dielectric layer 20 and on the source regions 26. The nitride deposition is etched to form spacers 80, as illustrated in FIG. 10.

Using the spacers 80 as a self-aligned mask, p-type dopants are implanted into the body region 16 for defining source/body contact regions 82, as illustrated in FIG. 11. The p-type dopants, such as Boron, are implanted at a high energy in order to penetrate through the source regions 26. The Boron may be implanted using a dose within a range of about $2E15/cm^2$ to $2E16/cm^2$, for example, and at an energy level within a range of about 120 to 400 keV, for example. An anneal is performed afterwards within a temperature range of about 900 to 1,100 degrees C.

The spacers 80 are removed and a source electrode 84 is formed on the source regions 26. The method further includes forming at least one conductive via 86 between the source electrode 84 and the source/body contact regions 82. A drain electrode is on the underside of the substrate 8.

The source/body contact regions 82 are continuously in contact between the body region 16 and the source regions 26. In other words, each power MOSFET includes a source/body contact region 82. This helps to reduce the on-resistance of the power MOSFET 70. This also helps to decrease the base resistance and the common base current gain of the parasitic BJT. The parasitic BJT will be turned on at a higher current, resulting in an improved SOA and a higher UIS capability.

In addition, the on-resistance is reduced because the cell pitch of the power MOSFET 70 is reduced as a result of the dielectric layer 20 being formed completely within the trench 14. In other words, the dielectric layer 20 is not on the surface of the source regions 26 which would minimize the contact region between the source regions and the source electrode 84. As a result, the body region 16, the gate 12, the source regions 26, and the source/body contact regions 82 define a cell pitch of about 0.5 microns, for example.

Instead of using high energy to implant the dopants to define the source/body contact regions 82, low energy may be used provided the spacers 80 are used as a self-aligned mask for removing a portion of the source regions 26 not covered by the spacers. As best illustrated in FIG. 12, a portion of the source regions 26 not covered by the spacers 80 has been removed. This power MOSFET is represented by reference 70'.

Removing a portion of the source regions 26 has the advantage of permitting the source/body contact regions 82 to be defined using low energy. The p-type dopants, such as Boron, may also be implanted using a dose within a range of about $2E15/cm^2$ to $2E16/cm^2$, for example, but the energy is now within a range of about 40 to 120 keV, for example. As discussed above, an anneal is performed afterwards within a temperature range of about 900 to 1,100 degrees C. This power MOSFET is represented by reference 70' in FIG. 12.

As another embodiment, the portion of the source regions 26 not covered by the spacers 80 are completely removed. After the source/body contact regions 82 have been defined using low energy, the source electrode 84 is in direct with the contact regions. This power MOSFET is represented by reference 70" in FIG. 13.

An advantage of removing all of the source regions 26 not covered by the spacers 80, and even part of the underlying body region 16, is that the source/body contact regions 82 may be formed deeper within the body region 16. This decreases the common base current gain of the parasitic BJT, which helps to improve device ruggedness, i.e., increase the safe operating range (SOA) and increase the unclamped inductive switching (UIS) of the power MOSFET.

Figure 15:
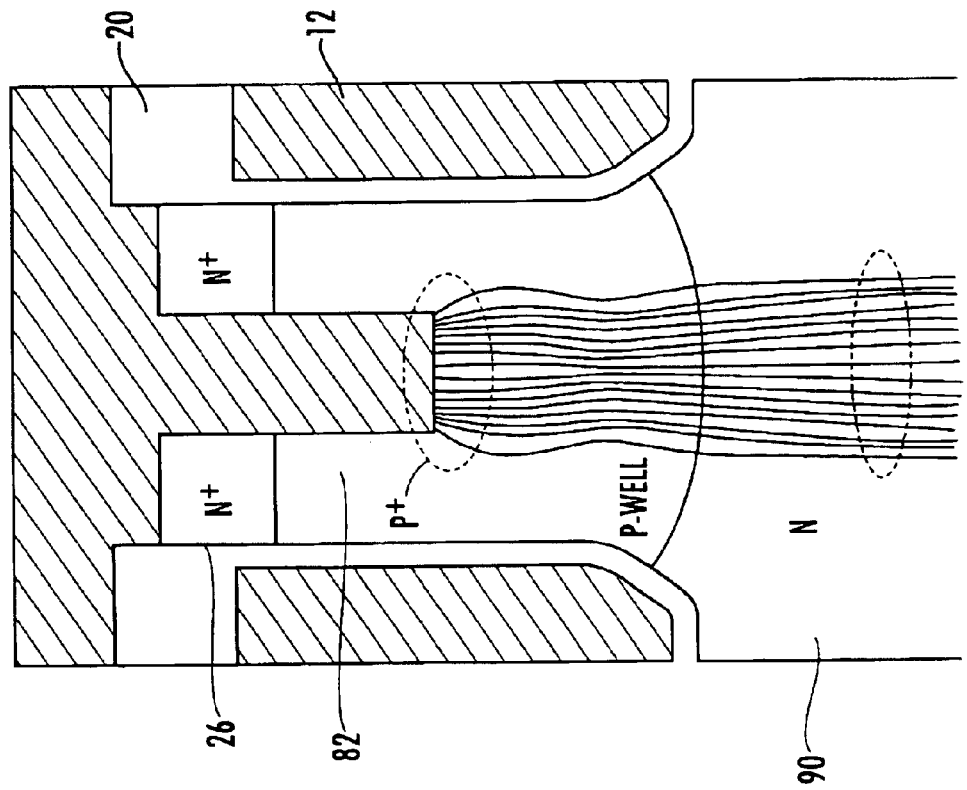
FIGS. 14–15 are cross-sectional views of a portion of adjacent trench-gated power MOSFETS illustrating the path of the avalanche breakdown current based upon the depth of the source/body contact regions in accordance with the preset invention.
Figure 14:
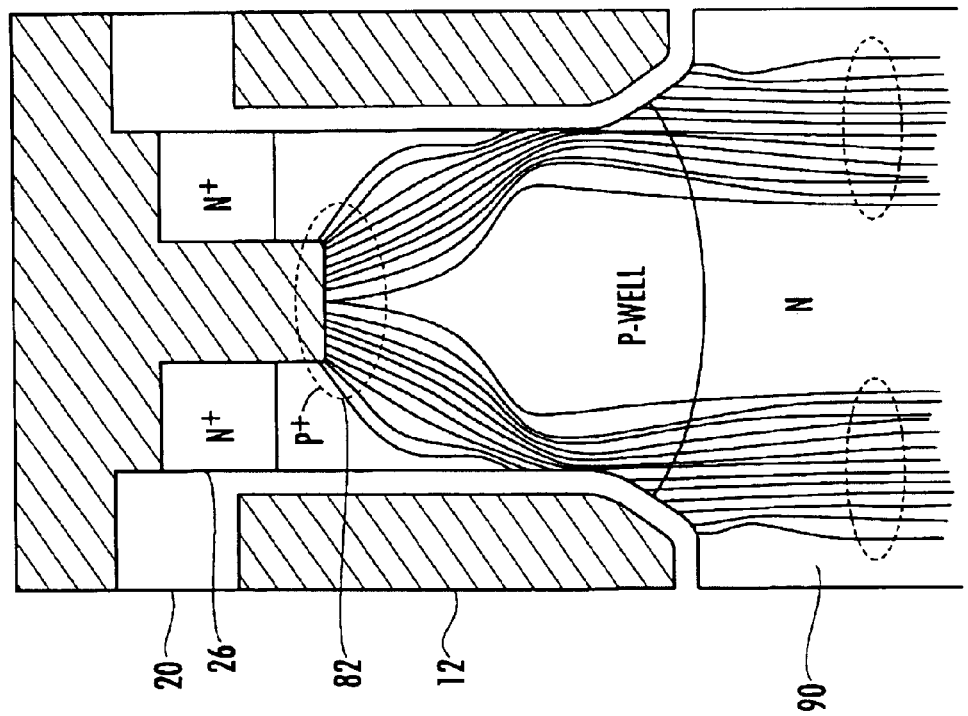

The depth of the source/body contact regions 82 also effects the path of the avalanche breakdown current, as best illustrated in FIGS. 14 and 15. For example, when the spacers 80 are used to etch through the source regions 26 and into the body region 16 corresponding to a depth of 0.5 microns, for example, the simulated avalanche breakdown current 90 flows to the bottom of the trench 14 before reaching the source/body contact regions 82, as illustrated in FIG. 14. This corresponds to a block voltage (VDSBR) of 39.67 V.

However, by increasing the depth of the etch to 0.8 microns, for example, the simulated avalanche breakdown current 90 has a shorter path to follow since it does not flow to the bottom of the trench 14, as illustrated in FIG. 15. This corresponds to a block voltage (VDSBR) of 36.75 V. Consequently, the trench-gated power MOSFET devices in FIG. 15 are more rugged than the devices illustrated in FIG. 14.

Another aspect of the present invention is directed to the power MOSFET 70 formed as a result of the above disclosed process. The power MOSFET 70 comprises a semiconductor layer 8,9 having a trench 14 therein, a gate dielectric layer 24 lining the trench, and a gate conducting layer 12 in a lower portion of the trench.

A dielectric layer 20 is in an upper portion of the trench 14 and extends outwardly from the semiconductor layer 8,9. Source regions 26 are adjacent the outwardly extending dielectric layer 20, and source/body contact regions 82 are laterally spaced from the gate conducting layer 12.

Figure 13:
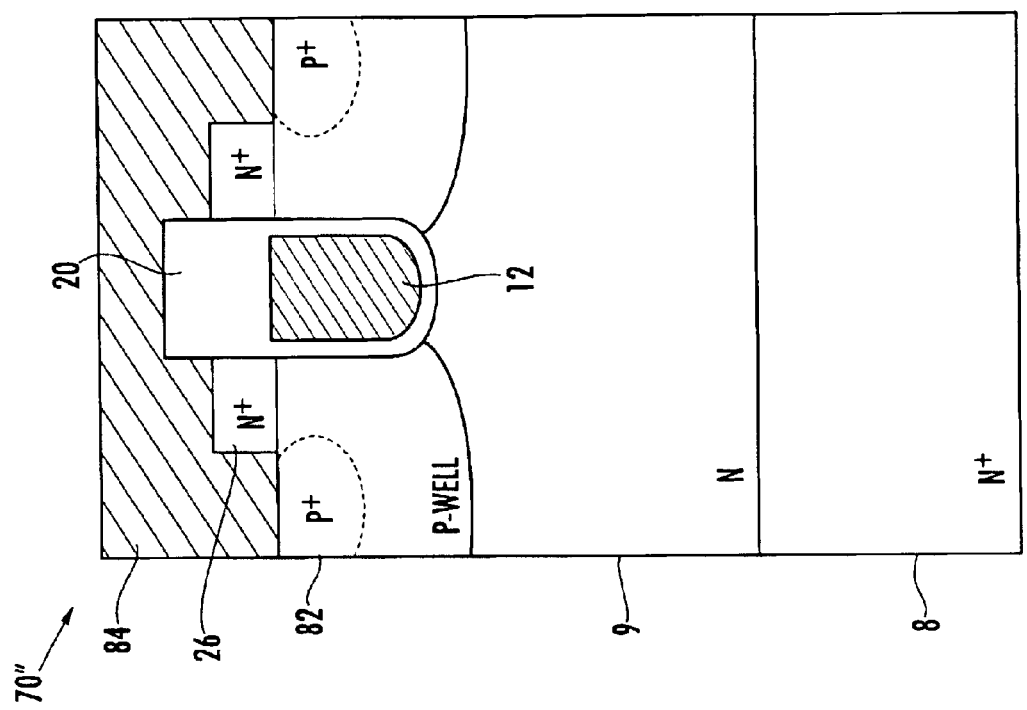

Another embodiment of the power MOSFET 70' is with respect to the source regions 26, wherein a portion of the source regions include a recess over the source/body contact regions, as best illustrated in FIG. 12. In yet another embodiment of the power MOSFET 70", the source regions 26 includes an opening exposing the body region 16 so that the source electrode 84 is in contact with a source/body contact region 82, as best illustrated in FIG. 13.

Figure 16:
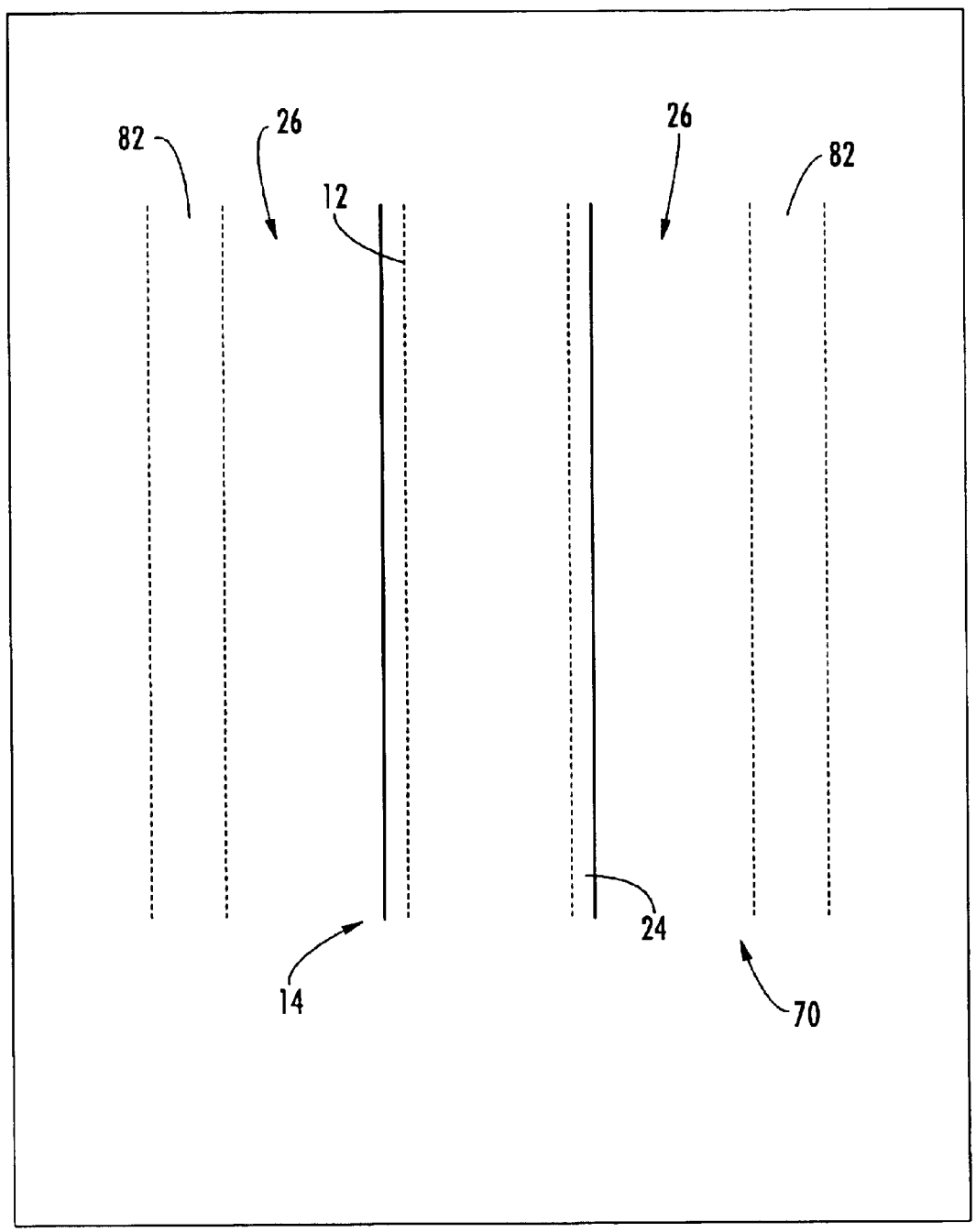
FIG. 16 is a top plan view of the trench-gated power MOSFET according to the present invention.

Referring now to FIG. 16, the top plan view of the trench-gated power MOSFET 70 illustrates that the source/body contact regions are laterally spaced apart from the gate conducting layer 24. The MOSFET 70 is advantageously formed with a reduced on-resistance without degrading device ruggedness. The on-resistance is reduced since the source/body contact regions 82 are laterally spaced apart from the gate conducting layer 24. The source/body contact regions 82 thus provide an efficient short between the source and body regions of the MOSFET 70. As a result, device ruggedness is increased.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that modifications and embodiments are intended to be included within the scope of the appended claims.

What is claimed is:

1. A MOSFET comprising:
   a semiconductor layer having a trench therein;
   a gate conducting layer in a lower portion of said trench;
   a dielectric layer in an upper portion of said trench;
   source regions adjacent said dielectric layer; and
   source/body contact regions laterally spaced apart from said trench and being recessed within said semiconductor layer and non-interruptively contacting said source regions;
   said dielectric layer extending outwardly from said semiconductor layer, said source regions and said source/body contact regions, and said outwardly extending dielectric layer having sidewalls aligned with sidewalls of said trench.

2. A MOSFET according to claim 1, further comprising a source electrode on said source regions and on said dielectric layer.

3. A MOSFET according to claim 2, further comprising at least one conductive via between said source electrode and said source/body contact regions.

4. A MOSFET according to claim 1, wherein a portion of said source regions include a recess over said source/body contact regions.

5. A MOSFET according to claim 1, wherein a portion of said source regions include an opening exposing said source/body contact regions; and further comprising a source electrode on said source regions, on said dielectric layer, and on said source/body contact regions.

6. A MOSFET according to claim 1, wherein said outwardly extending dielectric layer extends from said source regions equal to or less than about 1 micron.

7. A MOSFET according to claim 1, wherein said gate is recessed in said trench within a range of about 0.2 to 0.8 microns from an opening thereof.

8. A MOSFET according to claim 1, wherein an upper surface of the recess is equal to or less than a depth of about 1 micron from a surface of the semiconductor layer.

9. A MOSFET comprising:
   a semiconductor layer having a trench therein;
   a gate dielectric layer lining said trench;
   a gate conducting layer in a lower portion of said trench;
   a dielectric layer in an upper portion of said trench;
   source regions adjacent said dielectric layer;
   source/body contact regions laterally spaced from said gate conducting layer and non-interruptively contacting said source regions;
   said dielectric layer extending outwardly from said semiconductor layer, said source regions and said source/body contact regions, and said outwardly extending dielectric layer having sidewalls aligned with sidewalls of said trench;
   a source electrode on said source regions and on said dielectric layer; and
   at least one conductive via between said source electrode and said source/body contact regions and extending through said source regions.

10. A MOSFET according to claim 9, wherein a portion of said source regions include a recess over said source/body contact regions.

11. A MOSFET according to claim 9, wherein said outwardly extending dielectric layer extends from said source regions equal to or less than about 1 micron.

12. A MOSFET according to claim 9, wherein said gate conducting layer is recessed in said trench within a range of about 0.2 to 0.8 microns from an opening thereof.

13. A MOSFET comprising:
   a semiconductor layer having a trench therein;
   a gate dielectric layer lining said trench;
   a gate conducting layer in a lower portion of said trench;
   a dielectric layer in an upper portion of said trench and extending outwardly from said semiconductor layer;
   source regions adjacent said dielectric layer and including an opening therein; and
   source/body contact regions laterally spaced from said gate conducting layer and non-interruptively contacting said source regions, said source/body contact regions being exposed by the opening in said source regions;
   said dielectric layer extending outwardly from said semiconductor layer, said source regions and said source/body contact regions, and said outwardly extending dielectric layer having sidewalls aligned with sidewalls of said trench.

14. A MOSFET according to claim 13, further comprising a source electrode on said source regions, on said dielectric layer, and on said source/body contact regions.

15. A MOSFET according to claim 13, wherein said outwardly extending dielectric layer extends from said source regions equal to or less than about 1 micron.

16. A MOSFET according to claim 13, wherein said gate conducting layer is recessed in said trench within a range of about 0.2 to 0.8 microns from an opening thereof.

* * * * *